(12) United States Patent
Tansey (10) Patent No.: US 7,531,780 B1
(45) Date of Patent: May 12, 2009

(54) SPECTRUM ANALYZER DEVICE ON A CHIP

(75) Inventor: Richard J. Tansey, Half Moon Bay, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 279 days.

(21) Appl. No.: 11/240,537

(22) Filed: Oct. 3, 2005

(51) Int. Cl.
- H01L 27/00 (2006.01)
- G01J 1/44 (2006.01)
- G06K 9/36 (2006.01)

(52) U.S. Cl. ............ 250/208.1; 250/206; 382/280
(58) Field of Classification Search ........... 250/208.1, 250/390.07–390.12, 391, 214.1, 214 R; 73/659; 327/514

See application file for complete search history.

(56) References Cited

U.S. PATENT DOCUMENTS

| | | | | |
|---|---|---|---|---|
| 4,950,880 | A * | 8/1990 | Hayner | 250/201.9 |
| 5,987,395 | A * | 11/1999 | Donges | 702/158 |
| 6,555,804 | B1 * | 4/2003 | Blasing | 250/208.1 |
| 6,593,562 | B1 * | 7/2003 | Parrish et al. | 250/208.1 |
| 2004/0061863 | A1 * | 4/2004 | Digonnet | 356/460 |

OTHER PUBLICATIONS

Dannie Lau et al., FPGA based Structures for On-Line FFT and DCT, IEEE Apr. 21-23, 1999 p. 310-311.*
Wolfram Math World, http://mathworld.wolfram.com/SpectralPowerDensity.html.*

* cited by examiner

*Primary Examiner*—Georgia Y Epps
*Assistant Examiner*—Jennifer Bennett
(74) *Attorney, Agent, or Firm*—McDermott Will & Emery LLP (57) ABSTRACT

A spectrum analyzer device is provided having an optical "pixel" sensor array in a focal plane on a single chip, and a dedicated processor for each optical sensor that performs a pixel-based calculation of the power spectral density for the illumination captured by the optical sensor. Photoelectrons are maintained on the chip, thereby resulting in a significantly improved signal-to-noise ratio for the device. The device includes a sensor array having optical sensors arranged in a focal plane, where each optical sensor outputs a photon output signal upon receiving reflected illumination. The device also includes transform analysis units which receive the photon output signals from corresponding optical sensors and output power spectral density signals. Sampling circuits output the power spectral density signals from corresponding transform analysis units, and an array storage device receives the power spectral density signals from the sampling circuits and converts them to corresponding illumination intensity signals.

35 Claims, 5 Drawing Sheets

SPECTRUM ANALYZER DEVICE ON A CHIP

CROSS-REFERENCE TO RELATED APPLICATIONS

None

STATEMENT AS TO RIGHTS TO INVENTIONS MADE UNDER FEDERALLY SPONSORED RESEARCH OR DEVELOPMENT

Not applicable to this invention.

BACKGROUND OF THE INVENTION

1. Field of the Invention

The invention is generally directed to a spectrum analyzer which has a dedicated processor for each focal plane pixel sensor in order to perform an immediate pixel-based calculation of the power spectral density of the illumination reflected from a target. In this manner, a spectrum analyzer is provided with significantly improved signal-to-noise ratio.

2. Description of the Related Art

In general, one of the most important factors that allows any electro optical system to function as designed is the signal-to-noise (SNR) ratio obtained for a given situation. In general, a larger SNR results in better, or at least more reliable operation. A poor, or low SNR causes faulty and unreliable or poor performance. In a typical electro-optical sensor, a sensor is positioned in the instrument in the normal manner it was designed for, both electrically and optically. This usually consists of a suitable collective aperture to collect the light, an optical instrument to focus the light in the sensor, and suitable electronics to record the photoelectrons generated by the sensor. In most common sensors, the output signal results from the measurement of photoelectrons generated from interaction of the incoming laser light source with the detector substrate. For visible light sensors, for example, photons produce electrons which are generated from hole pairs produced in an NPN junction. This change in balance generates a current which is measured as a resistor change (photoconductive mode), or as a voltage change (photoconductive mode). We will refer to this type of sensor as a "square law" detector, which gets its name from the fact that the light intensity is proportional to the square of the electrical field of the incident light wave. In this case, either the current or voltage output by the sensor is proportional to the amplitude of the intensity of the light received by the sensor.

The problem with this sort of typical device is that any photons received will be recorded as photoelectrons over a wavelength operating capability of the device. Sunlight, moonlight, starlight, scattered laser light from aerosols or clouds, urban street lights or car lights, and battlefield explosions or other stray light sources, all contribute to the background "noise" recorded by the device. With respect to these types of devices, "photon noise" is usually defined as any photoelectrons generated, which are not part of the target's signal but which contribute to the final current or voltage output by the sensor.

In addition to other photon sources generating the noise signal, any electrical disturbances which contribute to the current or voltage output by the sensor, but which are not part of the target signal, cause additional noise. Entire companies, and an active industry, are employed in building suitable electronic amplifiers, filters, and circuits designed to reduce these purely "circuit noise" effects.

Accordingly, it is desirable to develop an electro-optical sensor device which can reduce or eliminate the "photon noise" from the sensor's output, while providing an accurate measurement of the target illumination detected by the sensor.

SUMMARY OF THE INVENTION

This present invention reduces the foregoing problems by providing a spectrum analyzer device comprised of an array of optical "pixel" sensors in a focal plane on a single chip, and having a dedicated processor for each optical pixel sensor in order to perform an immediate pixel-based calculation of the power spectral density of the reflected illumination captured by the optical pixel sensor. In this manner, no photoelectrons leave the chip between the detection by optical pixel sensor of reflected illumination from a target and the calculation of the power spectral density of the detected illumination, thereby resulting in a significantly improved signal-to-noise ratio for the device.

The increased signal-to-noise ratio of the present invention allows it to have beneficial use in almost all electro-optical sensors currently used in various defense-related applications. Some of these applications include, but are not limited to, Ladar, vibration sensing, wave front sensing, range detection, ATP (acquisition, tracking and pointing), imaging, discrimination, identification, spectroscopy, polarization, colorimetry and radiometry.

Specifically, according to one aspect of the invention, a spectrum analysis device and method are provided for determining the power spectral density of illumination reflected from a target. The device includes a sensor array comprised of a plurality of optical sensors being arranged in a focal plane, each optical sensor outputting a photon output signal when the optical sensor receives illumination reflected from a target, a plurality of transform analysis units, each transform analysis unit being disposed adjacent to a corresponding optical sensor, receiving the photon output signal from the corresponding optical sensor, and outputting a power spectral density signal corresponding to the received photon output signal. The device also includes a plurality of sampling circuits, each sampling circuit obtaining the power spectral density signal from a corresponding transform analysis unit, and outputting the power spectral density signal to a selected output pathway on a periodic schedule in accordance with a sampling control input signal, and an array storage device that receives the power spectral density signal from each of the plurality of sampling circuits and converts each received power spectral density signal to a corresponding illumination intensity signal.

Preferably, the target is illuminated by an amplitude modulated laser source having a pure sine or pure cosine waveform. In addition, the sensor array is preferably a CMOS array of pixel-level digital optical sensors disposed on a single chip, and each transform analysis unit is also disposed on the single chip immediately adjacent to the corresponding pixel-level optical sensor, the transform analysis unit being comprised of a VLSI processor on the chip. The range of amplitude modulation of the illumination (laser) source is provided to each transform analysis unit to determine the power spectral density of the signal received from the optical sensor for the desired modulation range. In this regard, each transform analysis unit uses a Fast Fourier Transform (FFT) processing calculation method to generate the power spectral density signal in correspondence with the received photon output signal from the optical sensor. Preferably, an amplifier is disposed between the optical sensor and the corresponding transform analysis unit in order to amplify the photon output signal from the optical sensor before it is sent to the corresponding transform analysis unit.

In this manner, the present invention provides a means to improve the measurement and collection of signal photons which have been received in the sensor from a laser source which is directed at the receiving telescope from a distance or which has been reflected from a target by a suitably pointed laser transmitter or similarly suitable illumination source.

The invention will be better understood upon reference to the following detailed description in connection with the accompanying drawings and appended claims.

DETAILED DESCRIPTION

As mentioned above, the invention is generally directed to a spectrum analyzer device comprised of an array of optical "pixel" sensors in a focal plane on a single chip, and having a dedicated transform analysis processor dedicated to each optical pixel sensor in order to perform an immediate pixel-based calculation of the power spectral density for the reflected illumination captured by the optical pixel sensor. In this manner, the signal-to-noise ratio for the device is significantly improved.

As mentioned above, the invention has a dedicated transform analysis processor for determining the power spectral density of the signal from a corresponding optical sensor. The transform analysis processor uses a Fast Fourier Transform calculation method to quickly and accurately determined the power spectral density. In this regard, the Fast Fourier Transform calculation method is particularly well suited to the present invention for determining the power spectral density, and hence intensity, of the illumination captured by the corresponding optical sensor.

In general, the invention can be understood using the theory of Fourier transforms. Any electromagnetic wave can be represented by a time varying E field:

$$E(t)=|E|\cos(wt+\Phi) \quad \text{Equation (1)}$$

where $|E|$ is the absolute magnitude of the E field, $w=2\pi f$ is the frequency, and $\Phi$ is the phase. When a light beam propagates to a target, is reflected from the target, and then collected by a telescope and directed to a sensor, a square law detector coverts the light intensity to current or voltage which is proportional to the energy of the wave. This energy represents the square of the amplitude of the E field, which is known as the intensity.

$$\text{Intensity=Energy}=\frac{1}{2}\int |E|^2 \delta\tau \quad \text{Equation (2)}$$

The important point here is that the main role of a sensor is to convert the magnitude-squared of the E field, which is directly proportional to the light intensity, to a suitably transformed current or voltage which can then be recorded or measured. From Fourier's treatment of a time varying signal, he showed that any such signal can be represented in a series of sine and cosine terms.

Thus, the E field generated in Equation (1) above is a continuous function of time, which can be represented by a discrete series given by:

$$\frac{a_0}{2} + \sum_{n=1}^{\infty} [a_n\cos\omega nt + b_n\sin\omega nt] = f(t).$$

where $$a_0 = \frac{1}{T}\int_0^T f(t)dt \text{ and } \omega = 2\pi f = \frac{2\pi}{T}$$

and where $$a_n = \frac{2}{T}\int_0^T f(t)\cos\omega_n t dt \text{ and } b_n = \frac{2}{T}\int_0^T f(t)\sin\omega_n t dt$$

Expression (3) is the Fourier representation of the continuous time varying function f'(t), from the continuum $-\infty<t<\infty$ to the discrete function f(t) where $0<t<T$ or $$\frac{-T}{2} < t < \frac{T}{2}.$$

This is called the discrete Fourier transform of f(t), otherwise referred to as the DFT.

We desire the amplitude squared of the DFT in expression (3) above, but from Parseval's theorem (also known in various guises as "energy theorem," "Rayleigh theorem," and the "Power Theorem."), we obtain the following equation:

$$\frac{1}{T}\int_0^T f^2(t)dt = a_0 + \frac{1}{2}\sum_{n=1}^{\infty} (a_n^2 + b_n^2)$$

Parseval's theorem states that the sum of the squares of the Fourier coefficients in the DFT is equal to the average of the square of f(t) over the period T. But for our case, the magnitude of the E field $|E(t)|=f(t)$, and therefore:

$$\frac{1}{T}\int_0^T E^2(t)dt =$$

the right hand side of Equation (4) above.

Consider the case of a pure cosine wave as generated by an acousto-optic modulator or by a rotating one-half wave plate:

$$E(t)=A\cos\omega nt, \text{ where } |E|=A, \text{ period}=T, \text{ frequency}=1/T, \text{ and} \quad \text{Equation (6)}$$

$$\omega = 2\pi f = \frac{2\pi}{T}.$$

Using Parseval's theorem of Equation (4), and calculating the coefficients from the DFT in Equation (3):
$a_o=0$ (for o),
$a_1=A$ (all other $a_n=0$ for n=2 to ∞), and,
$b_n=0$ (for n=1 to ∞).

$$\text{Intensity} = \frac{1}{T}\int_0^T E^2(t)dt = \frac{A^2}{2},$$

but E(t)=DFT which shows that the amplitude of the time varying signal in Equation (6) can be directly obtained from the square of the average DFT.

For the pure cosine signal of Equation (6), the intensity, or square of the amplitude, could be directly obtained by simply integrating Equation (7) without the use of Parseval's theorem. However, in most cases, especially in high noise situations, the signal will have random noise terms, and a convoluted expression due to background light levels, thermal noise, shot noise, platform or target jitter, and other sources.

Thus, a more representative signal arising from the detector would be:

$f(t)=E(t)+Rand(t)+Therm(t)+back(t)+$          Equation (8)

The direct integration of the function represented in Equation (8) to find the square of the average DFT of the signal would not be solvable, except by integral approximation techniques. It was for just this problem that the Fast Fourier Transform (FFT) was designed, which allows an approximation of the square of the average DFT of this convoluted signal. Finally, using Parseval's theorem, it can be seen that the FFT can be used to directly obtain an approximation of the amplitude squared, and thus the intensity, of the noisy convoluted signal of Equation (8):

$$\frac{1}{T}\int_0^T [FFT]^2 = \frac{1}{T}\int_0^T [DFT]^2 = \frac{1}{T}\int_0^T E^2(t)dt = \frac{A^2}{2}.$$

where $A^2$ is the amplitude squared of the E field without including any of the noise terms of Equation (8). The implementation of Equation (9) in a focal plane array allows for an efficient extraction of the signal intensity from the output current or voltage of each optical sensor (detector) or pixel.

The implementation of Equation (9) simply requires the generation of a pure sine or cosine wave. A laser source is amplitude modulated by any of a number of methods such as by chopping a cw laser source, using a pulsed laser with pulse width and period T=1/f where f is the pulse per second, modulating the current of a laser diode, and using an acousto-optic modulator, or other electro-optic phase modulating device.

After the received signal is collected by the telescope aperture and generates a current or voltage from the sensor, the |amplitude|$^2$, and hence intensity, of the signal can be extracted from the noise terms by obtaining the absolute value of square of the FFT. This is usually called the power spectral density (PSD) of the signal, since from Parseval's theorem, it represents the sum of the squares of the Fourier coefficients, which can be interpreted as the energy or power obtained in each Fourier component. Other components are not of concern because it is assumed that a pure sine or cosine laser is being used as an illumination source for the target. As shown in Equation (9) only one coefficient, or from the FFT one frequency amplitude, is determined.

However, if a pure sine or cosine wave is not generated as the illumination source, as would be the case if a 50% duty cycle square wave was formed from a chopper inserted in a cw laser, this technique will still obtain the amplitude of the signal from the first harmonic of the square wave, but this would have a reduced amplitude due to the other square wave coefficients. The result will be a reduced magnitude of the absolute value of the intensity, but all other detectors in the array will have the same relative voltages or currents due to any optical reflectance changes of the target. In other words, either a chopped square wave or pure sine wave will still result in the same relative intensities of the first harmonic.

Similarly, a pulsed laser could be used having a short pulse width (around 1 nsec) and high reference rate (10 Khz) which would produce a series of 1 nsec pulses represented by a period (T) of 100 usec. This would produce a so-called sine function sinx/x, which also will have a clearly defined amplitude obtained from the [FFT]$^2$.

In the present invention, a suitable analog or digital processor is configured to produce the [FFT]$^2$ of the time varying signal, representing voltage or current, from each pixel-level optical detector located at the focal plane of a receiver telescope. As mentioned above, this invention is dedicated to reduction of unwanted "photoelectron" noise in the sensor output, thereby reducing the signal-to-noise ratio. It should be noted that electrical circuit noise is not addressed in this invention, and it is assumed that the best electrical circuit engineering design is already employed in the device to reduce "circuit noise" to the extent possible.

Figure 1:
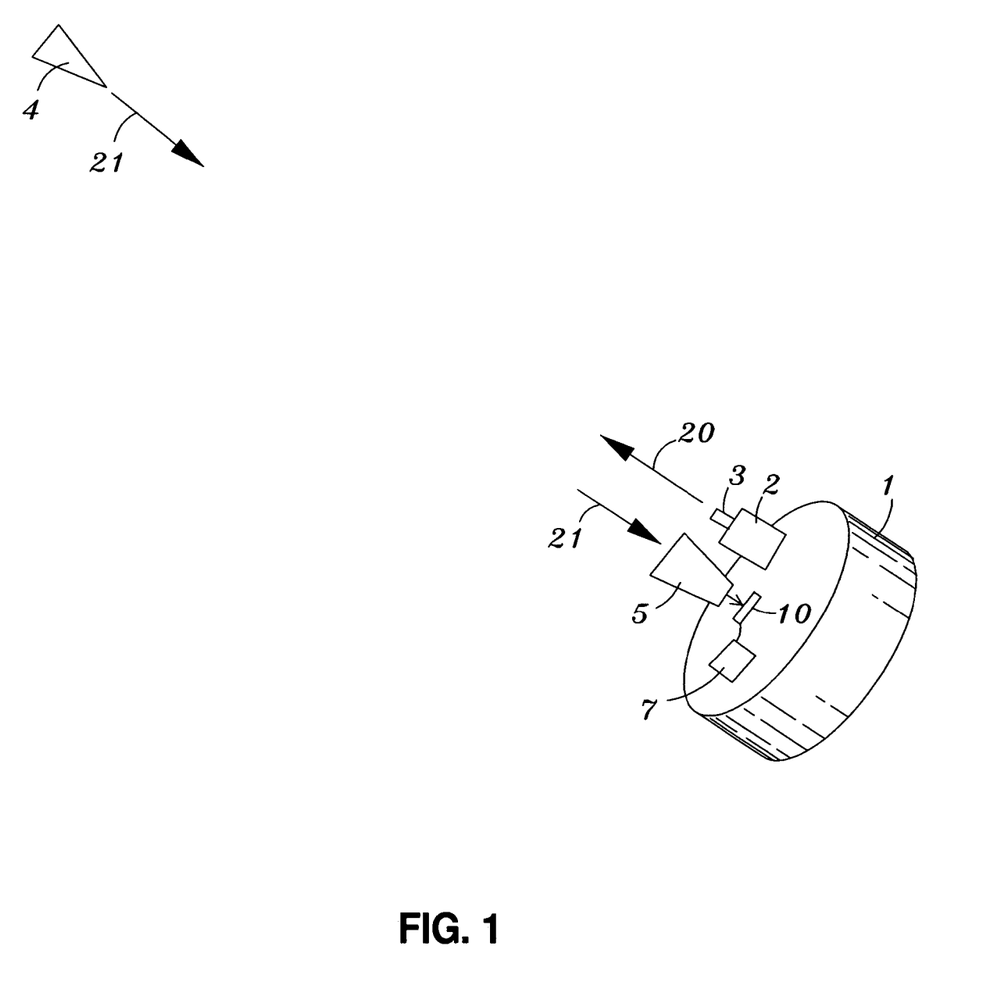
FIG. 1 is a schematic depicting an operational environment in which the invention can be practiced according to one embodiment of the present invention.

Turning to FIG. 1, a schematic is shown that depicts an operational environment in which the invention can be practiced according to one embodiment. Turning to FIG. 1, platform 1 is shown, on which illumination source 2, telescope 5, sensor array device 10, and control electronics 7 are disposed. As mentioned above, illumination source 2 is preferably a modulated laser, although other forms of illumination can be used, such as an incoherent illumination source. In this embodiment, illumination source 2 is a laser having a pure sine or pure cosine waveform, although chopper 3 is also provided for the case that a cw laser is used as illumination source 2, so as to create a 50% duty cycle square wave, as discussed above. The types of waveform and modulation of illumination source 2 can be any of those discussed above.

As seen in FIG. 1, illumination beam 20 from illumination source 2 is beamed toward target 4, which then reflects illumination reflection 21 back toward platform 1. Telescope 5 collects illumination reflection 21 and focuses it onto sensor array device 10, which is positioned at the focal plane of telescope 5. Control electronics 7 is used to control the operation of sensor array device 10 and illumination source 2. In this regard, the amplitude modulation range used to modulate illumination source 2 is provided to sensor array device 10 for use in determining the power spectral density of illumination reflection 21, as discussed in more detail below.

Figure 2:
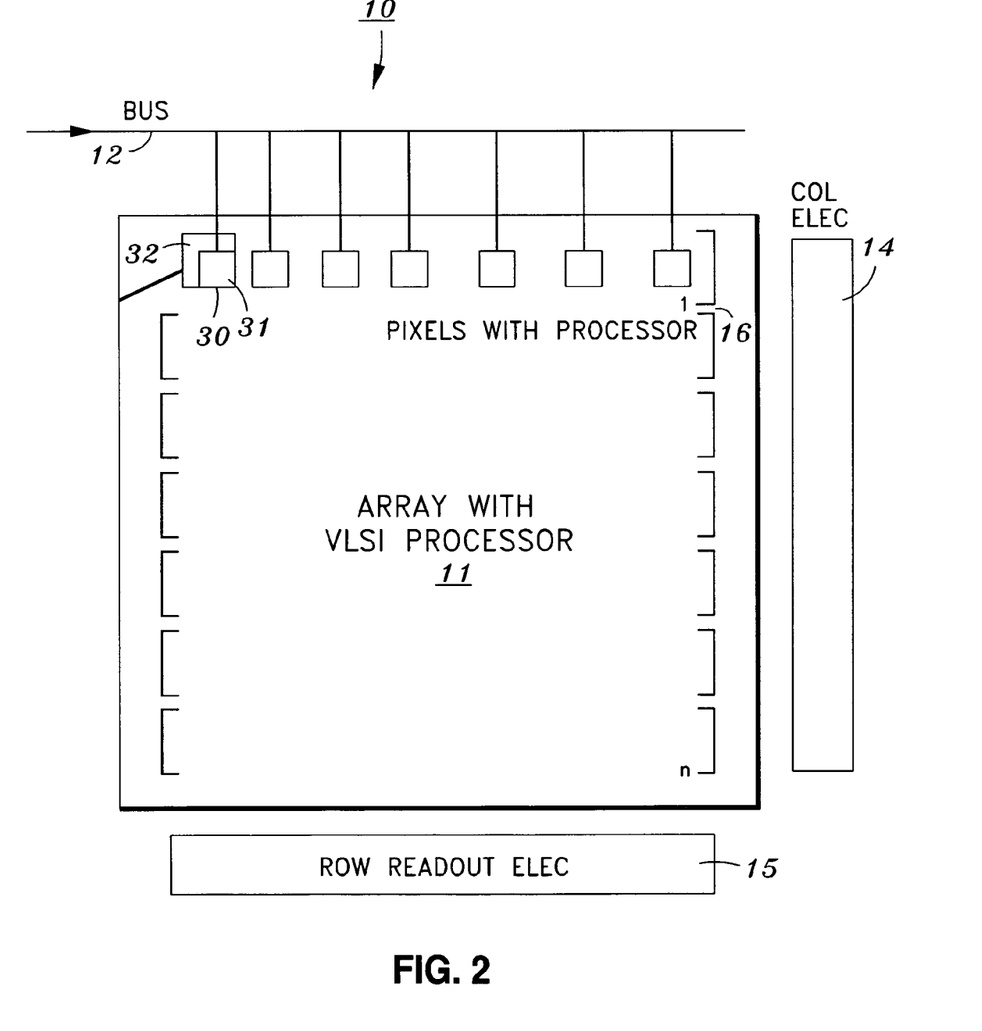
FIG. 2 is a schematic depicting the single-chip array of optical sensors and transform analysis processors according to one embodiment of the present invention.

FIG. 2 depicts single-chip sensor array device 10 that includes optical sensors and transform analysis processors according to a preferred embodiment of the present invention. As seen in FIG. 2, sensor array device 10 includes array 11, bus 12, column readout electronics 14 and row readout electronics 15. Array 11 is comprised of a grid array of pixel-level sensor units 30, each of which is comprised of optical sensor 31 and transform analysis unit 32. Preferably, array 11 is a CMOS chip, optical sensor 31 is a charge-coupled device, or photo-diode, and transform analysis unit 32 is an individual VLSI processor. In this manner, optical sensor 31 detects illumination and passes photoelectron directly to transform analysis unit which is disposed immediately adjacent to optical sensor 31, thereby allowing for immediate calculation of the power spectral density of the detected illumination without any photoelectrons leaving array 11. In the alternative, each transform analysis unit 32 can be an analog circuit or a combination of field programmable gate arrays configured to perform the same function as that of a VLSI processor for determining the power spectral density of an output signal from corresponding optical sensor 31.

Pixel-level sensor units 30 are arranged in a grid fashion of rows and columns in array 11. First row 16 of sensor units 30 is shown in FIG. 2 for descriptive purposes, and only the positions the second row through the nth row are shown for the sake of brevity. In this manner, each of sensor units 30 can represent a pixel of an image corresponding to the illumination collected by telescope 5 and focused onto sensor array device 10. Similarly, sensor units 30 are shown in FIG. 2 to be arranged in seven columns. Of course, these examples of the number of rows and columns for array 11 are for descriptive purposes only, and it should be appreciated that the number and arrangement of sensor units 30 is extensible and can be larger or smaller than that shown in FIG. 2. The description and functionality of pixel-level sensor units 30 are discussed more fully below.

Returning to FIG. 2, it can be seen that column readout electronics 14 is disposed in a vertical fashion adjacent to array 11, and that row readout electronics 15 is disposed in a horizontal fashion adjacent to array 11. These readout electronics are a type of array readout known in the art, and are used to readout the outputs of pixel-level sensor units 30 in a parallel manner, such as row by row, or column by column. Bus 12 is used to provide instruction to pixel-level sensor units 30 for control of the determination of the power spectral density of the illumination detected by each optical sensor.

Figure 3:
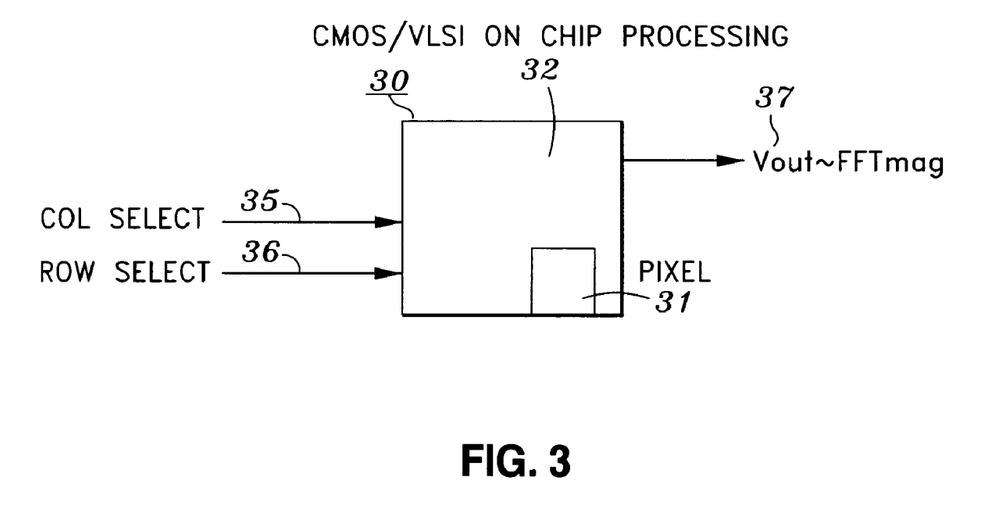
FIG. 3 is a schematic depicting the pixel-level components of the single-ship array shown in FIG. 2.

FIG. 3 depicts pixel-level sensor unit 30 of the single-ship array 11 shown in FIG. 2. In this regard, it can be seen that optical sensor 31 represents a pixel and is positioned on a portion of sensor unit 30. The remainder of the topography of sensor unit 30 is made up transform analysis unit 32, which is preferably a VLSI/CMOS "on-chip" processor. As seen in FIG. 3, transform analysis unit 32 has two input signals consisting of column select signal 35, and row select signal 36.

Column select signal 35 is provided by column readout electronics 14 and is used to instruct sensor unit 30 to generate and output the power spectral density value if sensor unit 30 is in the selected column. Similarly, row select signal 36 is provided by row readout electronics 15 and is used to instruct sensor unit 30 to generate and output the power spectral density value if sensor unit 30 is in the selected row.

Also as seen in FIG. 3, transform analysis unit 32 has an output signal consisting of Vout signal 37, which is a voltage that represents the power spectral density value determined by transform analysis unit 32 in accordance with the photoelectrons generated by optical sensor 31 of sensor unit 30. As discussed above with respect to Equations 1 to 9, the present invention uses a Fast Fourier Transform calculation to quickly determine the power spectral density of the detected illumination. In this regard, and as discussed above with respect to Equation 9, the square of the absolute value of the Fast Fourier Transform represents the power spectral density of the detected illumination.

Figure 4:
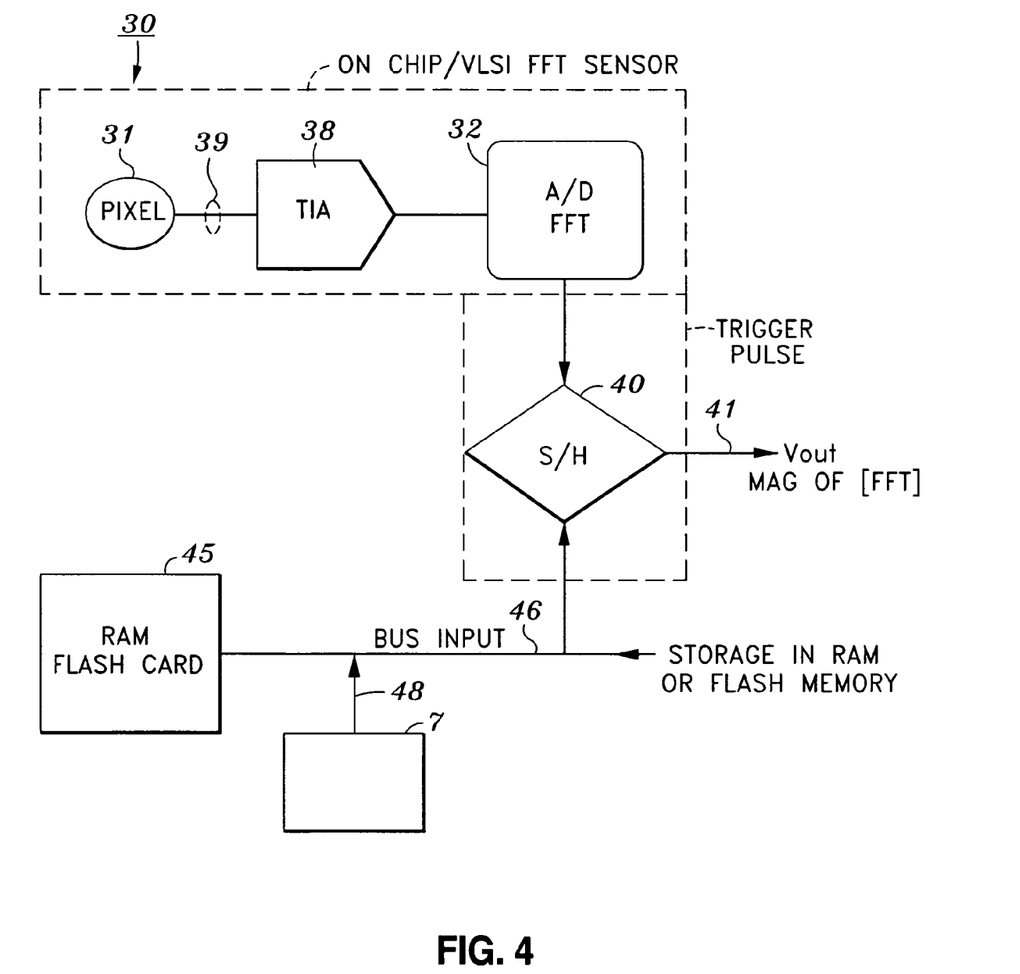
FIG. 4 is a block diagram depicting the functional components of the spectrum analysis device according to one embodiment of the present invention.

FIG. 4 is a block diagram depicting the functional components of sensor unit 30 as used in the present invention according to one embodiment. As seen in FIG. 4, sensor unit 30 includes optical sensor 31 (pixel), trans-impedance amplifier 38, transform (FFT) analysis unit 32 and sampling circuit 40. Optical sensor 31 captures reflected illumination from a target, as described above, and generates photoelectrons, which are then passed to transform (FFT) analysis unit 32. In the embodiment shown in FIG. 4, trans-impedance amplifier 38 is optionally provided to amplify the photoelectron signal output from optical sensor 31 before it is sent to transform (FFT) analysis unit 32.

Then, transform analysis unit 32, which can be either a digital VLSI processor or an analog circuit as discussed above, uses the Fast Fourier Transform method discussed above in order to determine the power spectral density of the detected illumination captured by optical sensor 31. Sampling circuit 40 is preferably a known type of sample-and-hold circuit and is used to obtain and output the value of the power spectral density determined by transform analysis unit 32 on a predetermined frequent basis as provided by control input signal 48 received via bus 46. Control input signal 48 is shown in FIG. 4 to be provided from control electronics 7, although it can be provided from other sources in other embodiments such as from a memory source, or even may be predetermined as a "hardwired" parameter in sampling circuit 40. In addition, control signal 48 preferably includes a destination signal which instructs sampling circuit 40 where to send the power spectral density output signal (squared magnitude of FFT). For example, control signal 48 can direct sampling circuit 40 to send power spectral density output signal 41 to a memory, such as RAM 45 shown in FIG. 4, or to a display (not shown) after being converted to an intensity value for display in conjunction with all other power spectral density output signals from all sensor units 30 on array 11. In this manner, an intensity based image of the reflected illumination from a target can be graphically viewed by a user. In the alternative, power spectral density output signal 41 can be sent to a control system for target tracking, and other applications which utilize detected intensity values of a detected illumination.

The above described invention can therefore operate to efficiently and accurately determine the power spectral density, and hence intensity, of detected illumination even in the presence of other optical noise. The present invention can allow the intensity of detected illumination to be extracted accurately even in a signal-to-noise ratio of 1/1000.

The embodiment of this invention described here is to use this SNR per pixel improvement to design and fabricate a device which has N×N pixels and contains the PSD processing either on or very close to the FPA chip. This device can be used for a fine tracker, imaging device, polarimeter, colorimeter, radiometer or other electro-optical display device having the ability to extract the optical display device with several orders of magnitude of noise above the signal.

Since a factor of 1000 noise above signal can be accommodated by using the present invention, known types of sensors now using laser sources, could accomplished the same function with a similar decrease in laser power. Based on the above discussion, this would result in using a 1 watt laser where a 100 W or 1000 W laser is currently employed.

The embodiment of the invention discussed above is to extract the intensity of the signal from the noise by finding the discrete-time Fourier transform of the samples of the signal (accomplished by constructing a time grid and FFT) and take the magnitude squared of the result. This process is also called a periodogram and results in the PSD (power spectral density). In some cases, the variances of the periodogram or PSD can be on the order of the PSD squared. Various techniques have been devised to improve the PSD and obtain a more accurate resultant amplitude of the Fourier coefficients, and thus the resultant intensity. These various techniques include the following:

(a) Break the signal into respective non-overlapping time sections and average the periodograms;

(b) Break the signal into overlapping sections and average the periodograms;

(c) Apply various nonrectangular data windows to produce a modified periodogram. These windows are devised to reduce aliasing and to smooth the Fourier transform process;

(d) Apply a combination of (a), (b) and (c) above which involves an average of periodograms of overlapped windowed signal sections. This is called the Welch Transform[1];

[1] Matlab Signal Processing Toolbox, V4, 1994

(e) Apply the multitaper approach which obtains a PSD from a combination of multiple orthogonal windows;

(f) Apply the maximum entropy approach which is a parametric mode of the autocorrelation function; and (g) Apply "MUSIC" which is a multiple signal classification or eigenvector method.

In view of the above, it should be appreciated that the embodiment of this invention is primarily concerned with an efficient calculation of the PSD of N×N signals of an array by having the calculation performed immediately adjacent to the optical sensor on a pixel level. Any of several methods can be used to calculate the PSD in the present invention, but the final choice of methods is expected to embody any combination of present state of the art techniques to obtain a PSD from a noisy signal. Techniques to extract the PSD from noise using wavelet transforms, such as a semi-blind noise-removal algorithm based on a steerable wavelet pyramid[2] can also be used.

[2] E. Simoncelli and E. Adelson, 3rd IEEE Conference on Image Processing, September 1996

The embodiment of the present invention described above requires the implementation of suitable "on chip" processing using FPGA or CMOS integration, or other means to allow calculation of the PSD within or very near to the focal plane or pixel. The magnitude of the signal obtained from the FPA will be the first harmonic of the PSD which is the light intensity. The voltage or current, although available, need not be used for a final display.

Figure 5:
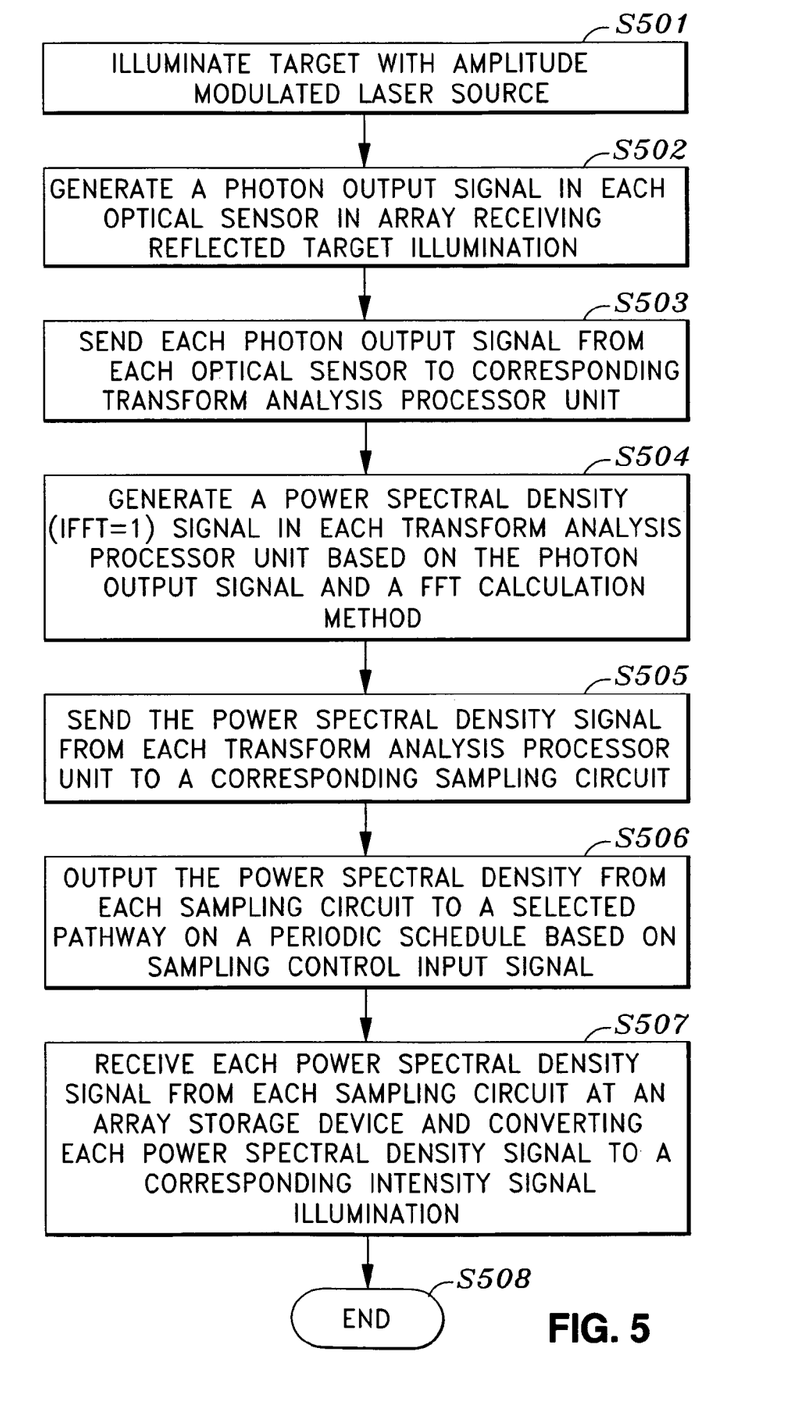
FIG. 5 is a flow chart depicting the operation of the spectrum analysis device according to one embodiment of the present invention.

The method according to one embodiment of the present invention is depicted in FIG. 5. In step S501 of FIG. 5, the target is illuminated with an amplitude-modulated laser source. Next, in step S502, a photoelectron output signal is generated in each optical sensor of the sensor array in response to reflected illumination received from the illuminated target. Each generated photoelectron output signal is sent from the respective optical sensor to the corresponding transform analysis unit which is disposed immediately adjacent the optical sensor on the sensor array chip (step S503). Each transform analysis unit then generates a power spectral density value in step S504 based on the square magnitude of the result from the Fast Fourier Transform calculation method based on the received photoelectron output signal.

Next, in step S505, the power spectral density value from each transform analysis unit is sent to a corresponding sampling unit. Each sampling unit then outputs the received power spectral density value to a selected destination pathway on a periodic schedule in accordance with a sampling control input signal (step S506). Then, in step S507, an array storage device receives each power spectral density value from the multitude of sampling circuits, and converts each power spectral density value to an illumination intensity value. The process then ends at step S508.

In this manner, the present invention provides an efficient and accurate determination of the power spectral density, and hence intensity, of received illumination on a pixel-by-pixel level, without having any photoelectrons leave the array chip.

As mentioned above, the present invention results in a dramatically increased signal-to-noise ratio, and therefore laser sources can be reduced in power by factors of 100 to 1000 while still allowing the same detectors (optical sensors) and related electronics to be used. In the alternative, the present invention can use the same power laser as conventional sensors, but this would result in dramatically increased ranges of target detection to the increased signal-to-noise ratio. This is very beneficial for acquisition, tracking and pointing (ATP) systems.

The present invention can be used in many applications. For example, a two-dimensional (2D) image of a target can be obtained with the "image" representing the magnitude of the PSD of the first harmonic of the modulated source. This image can represent: (a) vibration of the target at each pixel; (b) reflective vs. wavelength; (c) a differential absortance Ladar measurement at each pixel (DIAL); or (d) a three-dimensional (3D) image with ranging information from pixel returns from the pulsed laser.

In another application, the frequency of a single laser can be set up in bins of several different frequencies. In this manner, the response of a target could be obtained at several simultaneous frequencies. This could allow a powerful discrimination technique, or detection of a unique segregation of a target. Also, multiple lasers at different wavelengths could be simultaneously received using a separate FPA for each wavelength, or a λ multiplexer to record each PSD in separate time bins. A combination of using multiple laser frequencies and simultaneous use of multiple lasers at different wavelengths can also be used with the present invention for improved discrimination and segregation of a target.

The invention has been described with respect to particular illustrative embodiments. It is to be understood that the invention is not limited to the above-described embodiments and that various changes and modifications may be made by those of ordinary skill in the art without departing from the spirit and scope of the invention described herein.

What is claimed is:

1. A spectrum analysis device for determining the power spectral density of illumination reflected from a target, the device comprising:

a sensor array comprised of a plurality of optical sensors being arranged in a focal plane, each optical sensor for outputting a photon output signal when the optical sensor receives illumination reflected from a target;

a plurality of transform analysis units, each transform analysis unit being disposed adjacent to a corresponding optical sensor, each transform analysis unit for receiving the photon output signal from the corresponding optical sensor, and for outputting a power spectral density signal corresponding to the received photon output signal, wherein the power spectral density signal is an absolute value of a square of a Fast Fourier Transform (FFT) of the photon output signal;

a plurality of sampling circuits, each sampling circuit for obtaining the power spectral density signal from a corresponding transform analysis unit, and for outputting the power spectral density signal to a selected output pathway on a periodic schedule in accordance with a sampling control input signal; and an array storage device for receiving the power spectral density signal from each of the plurality of sampling circuits and for converting each received power spectral density signal to a corresponding illumination intensity signal.

2. The spectrum analysis device of claim 1, further comprising an illumination source that illuminates the target.

3. The spectrum analysis device of claim 2, wherein the illumination source is one of a cw laser, a pulsed laser and an incoherent light source.

4. The spectrum analysis device of claim 2, wherein the illumination source is modulated using one of an amplitude modulation and a frequency modulation.

5. The spectrum analysis device of claim 4, wherein the illumination source is modulated using frequency modulation within a predetermined frequency range.

6. The spectrum analysis device of claim 4, wherein the frequency modulation is imposed on the illumination source having a sine-based waveform.

7. The spectrum analysis device of claim 4, wherein the frequency modulation is imposed on the illumination source having a cosine-based waveform.

8. The spectrum analysis device of claim 4, wherein the frequency modulation is a square wave based waveform or other repetitive waveform.

9. The spectrum analysis device of claim 4, wherein the frequency modulation is imposed on the illumination source having a hybrid-based waveform comprised of both sine and cosine components.

10. The spectrum analysis device of claim 5, wherein the predetermined frequency range is provided to the plurality of transform analysis units and is used by each transform analysis unit to determine the power spectral density signal corresponding to the photon output signal received by the transform analysis unit.

11. The spectrum analysis device of claim 2, wherein the illumination source is a laser source that is amplitude modulated.

12. The spectrum analysis device of claim 1, wherein the sensor array is a CMOS array of digital optical sensors disposed on a single chip, and wherein the plurality of transform analysis units are also disposed on the single chip with each transform analysis unit being a separate VLSI processor disposed adjacent to a corresponding optical sensor.

13. The spectrum analysis device of claim 12, wherein each digital optical sensor represents a pixel of an image generated by the sensor array.

14. The spectrum analysis device of claim 1, wherein each transform analysis unit is a separate analog circuit disposed adjacent to a corresponding optical sensor, each transform analysis unit being configured to receive the photon output signal from the corresponding optical sensor and to output a power spectral density signal corresponding to the received photon output signal.

15. The spectrum analysis device of claim 1, wherein each transform analysis unit comprises a plurality of field programmable gate arrays which are configured to receive the photon output signal from the optical sensor corresponding to the transform analysis unit and to output a power spectral density signal corresponding to the received photon output signal.

16. The spectrum analysis device of claim 1, further comprising a plurality of amplifiers, each amplifier being disposed between an optical sensor and a corresponding transform analysis unit and configured to receive the photon output signal from the optical sensor, amplify the photon output signal and send the photon output signal to the corresponding transform analysis unit.

17. The spectrum analysis device of claim 1, wherein each sampling circuit is for receiving the sampling control input signal from an external processor or from a memory unit, the sampling control input signal including a sample frequency value representing the frequency at which the sampling circuit obtains the power spectral density signal from the corresponding transform analysis unit, and is for outputting the power spectral density signal to a selected output pathway, the selected output pathway being determined in accordance with a destination signal included in the sampling control input signal.

18. A method for determining the power spectral density of illumination reflected from a target, the method comprising the steps of:
generating a photon output signal from each of a plurality of optical sensors being arranged in a focal plane in a sensor array, each optical sensor generating a photon output signal when the optical sensor receives illumination reflected from a target;
sending the photon output signal generated from each of a plurality of optical sensors to a corresponding one of a plurality of transform analysis units, each transform analysis unit being disposed adjacent to a corresponding optical sensor and receiving the photon output signal from the corresponding optical sensor;
generating a power spectral density signal in each transform analysis unit based on the photon output signal received by the transform analysis unit, wherein the power spectral density signal is an absolute value of a square of a Fast Fourier Transform (FFT) of the photon output signal;
sending the power spectral density signal from each transform analysis unit to a corresponding one of a plurality of sampling circuits;
outputting the power spectral density signal from each of the sampling circuits to a selected output pathway on a periodic schedule in accordance with a sampling control input signal; and
receiving each power spectral density signal from each of the sampling circuits at an array storage device which converts each received power spectral density signal to a corresponding illumination intensity signal.

19. The method of claim 18, further including an illumination step of using an illumination source to illuminate the target.

20. The method of claim 19, wherein the illumination source is one of a cw laser, a pulsed laser and an incoherent light source.

21. The method of claim 19, wherein the illumination source is modulated using one of an amplitude modulation and a frequency modulation.

22. The method of claim 21, wherein the illumination source is modulated using frequency modulation within a predetermined frequency range.

23. The method of claim 21, wherein the illumination source is modulated to have a sine-based waveform.

24. The method of claim 21, wherein the illumination source is modulated to have a cosine-based waveform.

25. The method of claim 21, wherein the illumination source is modulated to have a hybrid-based waveform comprised of both sine and cosine components in a square wave.

26. The method of claim 22, wherein the predetermined frequency range is provided to the plurality of transform analysis units and is used by each transform analysis unit to generate the power spectral density signal corresponding to the photon output signal received by the transform analysis unit.

27. The method of claim 19, wherein the illumination source is a laser source that is amplitude modulated.

28. The method of claim 18, wherein the sensor array is a CMOS array of digital optical sensors disposed on a single chip, and wherein the plurality of transform analysis units are also disposed on the single chip with each transform analysis unit being a separate VLSI processor disposed adjacent to a corresponding optical sensor.

29. The method of claim 28, wherein each digital optical sensor represents a pixel of an image generated by the sensor array.

30. The method of claim 18, wherein each transform analysis unit is a separate analog circuit disposed adjacent to a corresponding optical sensor, each transform analysis unit being configured to receive the photon output signal from the corresponding optical sensor and to output a power spectral density signal corresponding to the received photon output signal.

31. The method of claim 18, wherein each transform analysis unit comprises a plurality of field programmable gate arrays which are configured to receive the photon output signal from the optical sensor corresponding to the transform analysis unit and to output a power spectral density signal corresponding to the received photon output signal.

32. The method of claim 18, further comprising an amplifying step in which an amplifier is disposed between each optical sensor and corresponding transform analysis unit, wherein the amplifier receives the photon output signal from the optical sensor, amplifies the photon output signal and sends the amplified photon output signal to the corresponding transform analysis unit.

33. The method of claim 18, wherein each sampling circuit receives the sampling control input signal from an external processor or from a memory unit, the sampling control input signal including a sample frequency value representing the frequency at which the sampling circuit obtains the power spectral density signal from the corresponding transform analysis unit, and outputs the power spectral density signal to a selected output pathway, the selected output pathway being determined in accordance with a destination signal included in the sampling control input signal.

34. The method of claim 1, wherein the square of the Fast Fourier Transform (FFT) is a square of the first harmonic of the Fast Fourier Transform.

35. The method of claim 18, wherein the square of the Fast Fourier Transform (FFT) is a square of the first harmonic of the Fast Fourier Transform.

* * * * *

UNITED STATES PATENT AND TRADEMARK OFFICE
CERTIFICATE OF CORRECTION

| | | |
|---|---|---|
| PATENT NO. | : 7,531,780 B1 | Page 1 of 1 |
| APPLICATION NO. | : 11/240537 | |
| DATED | : May 12, 2009 | |
| INVENTOR(S) | : Richard J. Tansey | |

It is certified that error appears in the above-identified patent and that said Letters Patent is hereby corrected as shown below:

Column 4, line 15: Add --Equation (3)--;

Column 4, line 50: Add --Equation (4)--;

Column 4, line 60: Add --Equation (5)--;

Column 5, line 15: Add --Equation (7)--;

Column 5, line 45: Add --Equation (9)--.

Signed and Sealed this

Twenty-second Day of December, 2009

David J. Kappos
*Director of the United States Patent and Trademark Office*